(12) United States Patent
Schwarz

(10) Patent No.: US 6,891,193 B1
(45) Date of Patent: May 10, 2005

(54) MRAM FIELD-INDUCING LAYER CONFIGURATION

(75) Inventor: Benjamin C. E. Schwarz, Sunnyvale, CA (US)

(73) Assignee: Silicon Magnetic Systems, San Jose, CA (US)

( * ) Notice: Subject to any disclaimer, the term of this patent is extended or adjusted under 35 U.S.C. 154(b) by 64 days.

(21) Appl. No.: 10/184,673

(22) Filed: Jun. 28, 2002

(51) Int. Cl.$^7$ .............................................. H01L 27/14
(52) U.S. Cl. ......................... 257/53; 257/414; 257/421; 365/158
(58) Field of Search ..................... 257/53, 414, 421; 365/158

(56) References Cited

U.S. PATENT DOCUMENTS

| | | | | |
|---|---|---|---|---|
| 5,732,016 A | * | 3/1998 | Chen et al. ................. | 365/158 |
| 5,892,708 A | * | 4/1999 | Pohm ......................... | 365/158 |
| 5,920,500 A | * | 7/1999 | Tehrani et al. .............. | 365/173 |
| 6,005,800 A | * | 12/1999 | Koch et al. ................. | 365/173 |
| 6,104,633 A | | 8/2000 | Abraham et al. | |
| 6,163,477 A | * | 12/2000 | Tran .......................... | 365/173 |
| 6,236,590 B1 | * | 5/2001 | Bhattacharyya et al. .... | 365/173 |
| 6,331,944 B1 | * | 12/2001 | Monsma et al. ............ | 365/171 |
| 6,392,924 B1 | * | 5/2002 | Liu et al. .................... | 365/158 |
| 6,424,561 B1 | * | 7/2002 | Li et al. ...................... | 365/158 |
| 6,430,085 B1 | * | 8/2002 | Rizzo .......................... | 365/173 |
| 6,466,471 B1 | * | 10/2002 | Bhattacharyya ............. | 365/55 |
| 6,576,480 B2 | * | 6/2003 | Chen ............................ | 438/3 |
| 6,597,049 B1 | | 7/2003 | Bhattacharyya et al. | |
| 2002/0012269 A1 | * | 1/2002 | Li et al. ...................... | 365/158 |
| 2002/0097601 A1 | * | 7/2002 | Hoenigschmid ............ | 365/171 |
| 2002/0109172 A1 | * | 8/2002 | Okazawa ..................... | 257/298 |
| 2002/0141232 A1 | * | 10/2002 | Saito et al. .................. | 365/158 |
| 2002/0153580 A1 | * | 10/2002 | Hosotani et al. ............ | 257/421 |
| 2002/0171100 A1 | * | 11/2002 | Phom ........................... | 257/310 |
| 2003/0104636 A1 | * | 6/2003 | Bloomquist et al. ........... | 438/3 |

FOREIGN PATENT DOCUMENTS

| | | | |
|---|---|---|---|
| JP | 4-023293 | * | 1/1992 |
| JP | 10-116490 | * | 5/1998 |
| JP | 2000-195250 | * | 7/2000 |
| JP | 2002-151660 | * | 5/2002 |

\* cited by examiner

*Primary Examiner*—Nathan J. Flynn
*Assistant Examiner*—Ahmed N. Sefer
(74) *Attorney, Agent, or Firm*—Kevin L. Daffer; Mollie E. Leilang; Conley Rose P.C.

(57) ABSTRACT

A magnetic random access memory (MRAM) device is provided which includes a conductive line configured to induce a magnetic field with a higher magnitude along at least a portion of a magnetic cell junction than along a spacing arranged adjacent to the magnetic cell junction. In some embodiments, the conductive line may include first portions aligned with a plurality of magnetic cell junctions and second portions aligned with spacings arranged between the plurality of magnetic cell junctions. In such an embodiment, the first portions preferably include different peripheral profiles than the second portions. A method for fabricating such an MRAM device is also provided herein. The method may include aligning magnetic cell junctions and first portions of a field-inducing line with each other such that at least part of the first portions of the field-inducing line are configured to conduct a higher density of current than second portions of the field-inducing line.

20 Claims, 5 Drawing Sheets

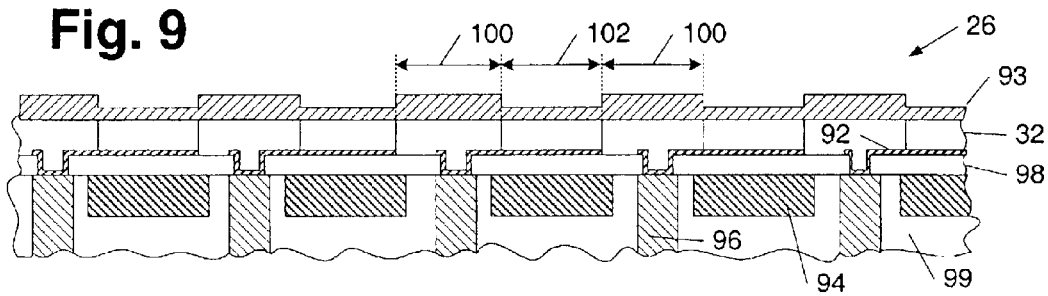

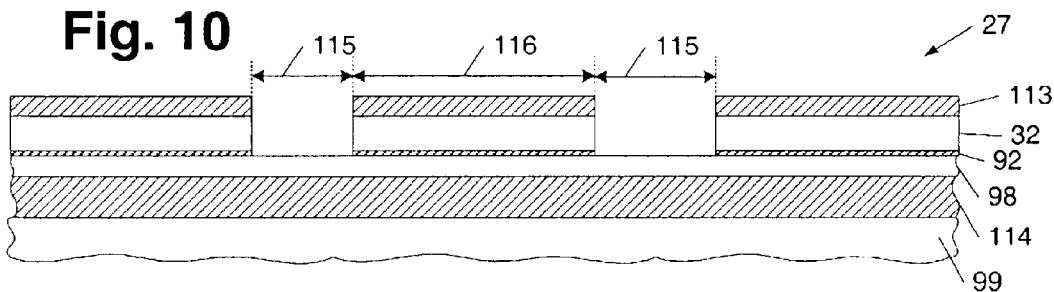

Fig. 11

Forming One or More Magnetic Cell Junctions Spaced Across a Semiconductor Topography — 120

↓

Forming a Field-Inducing Line above the One or More Magnetic Cell Junctions such that Portions of the Field-Inducing Line aligned with the Magnetic Cell Junctions have Different Peripheral Profiles than Portions of the Field-Inducing Line Aligned with Spacings Arranged Adjacent to the One or More Magnetic Cell Junctions — 122

Fig. 12

Forming a Field-Inducing Line upon a Semiconductor Topography with First Portions having Different Peripheral Profiles than Second Portions of the Field-Inducing Line — 124

↓

Forming Magnetic Cell Junctions in Alignment with the First Portions of a Field Inducing Line — 126

MRAM FIELD-INDUCING LAYER CONFIGURATION

BACKGROUND OF THE INVENTION

1. Field of the Invention

This invention relates to magnetic memory devices, and more particularly, to field-inducing line configurations arranged adjacent to magnetic cell junctions.

2. Description of the Related Art

The following descriptions and examples are given as background information only.

Recently, advancements in the use of magnetoresistive materials have progressed the development of magnetic random access memory (MRAM) devices to function as viable non-volatile memory circuits. In general, MRAM circuits exploit the electromagnetic properties of magnetoresistive materials to set and maintain information stored within individual magnetic memory cell junctions of the circuit. In particular, MRAM circuits utilize magnetization direction to store information within a memory cell junction, and differential resistance measurements to read information from the memory cell junction. More specifically, information is stored within an MRAM cell junction as a bit, the state of which is indicated by the direction of magnetization within one magnetic layer of the memory cell relative to another magnetic layer of the memory cell. In addition, a differential resistance can be determined from magnetization direction differences between the magnetic layers of the memory cell such that the state of the bit stored in the MRAM cell junction may be read.

Typically, an MRAM device includes a plurality of conductive lines with which to generate magnetic fields. In some cases, the conductive lines may be referred to as "bit" and "digit" lines. In particular, "bit" lines may refer to conductive lines arranged in contact with magnetic cell junctions that are used for both write and read operations of the memory cell junctions. "Digit" lines, on the other hand, may refer to conductive lines spaced adjacent to the magnetic cell junctions that are used primarily during write operations of the magnetic cell junctions. In general, an MRAM device may include a plurality of parallel bit lines spaced perpendicular to a plurality of parallel digit lines such that overlap points exists between the sets of parallel lines. Magnetic cell junctions as described above may be interposed between the conductive lines at such overlap points, such that an array of magnetic cell junctions may exist. During a write operation of an individual magnetic cell junction, current may be applied to the bit and digit lines corresponding to the particular memory cell such that a magnetic field may be created with which to orient the magnetic direction of the magnetic cell junction. Such an individual memory cell may herein be referred to as a selected memory cell, or the memory cell intentionally targeted for a writing procedure.

During the writing procedure, however, a multitude of other magnetic cell junctions arranged along the bit line and the digit line corresponding to the selected cell will also sense current. Such magnetic cell junctions are herein referred to as half-selected cells, or disturbed cells, since the magnetic field induced about the cells is generated from a single line rather than both the bit and digit lines. Even though less current is applied to these disturbed cells, variations within the cell junctions may allow a bit to be unintentionally written to one or more of the disturbed cells. The variations present within an array may include variations in the shapes and sizes of magnetic cell junctions, as well as the presence of defects. Such variations of the cell junctions may cause the amount of current needed to switch magnetic cell junctions in the array to vary, thereby reducing the reliability of the device. In this manner, the write selectivity of the MRAM array may be reduced. Write selectivity, as used herein, may refer to the ratio of selected cells and disturbed cells switched during a write operation of the device.

In general, the magnetic vectors within a magnetic layer will naturally align with the peripheral outline of the layer. As such, in some cases, an MRAM cell junction may be configured to initiate the switching mechanism used to change the magnetic direction of the cell at a particular point within the MRAM cell junction. For example, some conventional MRAM cell junctions are patterned to include rounded edges along opposing sides of the MRAM cell junction and substantially straight edges along other edges of the MRAM cell junction. In general, the magnetic vectors within regions of the MRAM cell junction including the rounded edges may be angled or curved with reference to the magnetic vectors aligned with the substantially straight edges of the MRAM cell junction since the magnetic vectors naturally align with the periphery of the layer.

Consequently, the magnetic vectors within the rounded edge region of the magnetic cell junction may be apt to switch their magnetic direction before the magnetic vectors aligned with the substantially straight edges of the magnetic cell junction. In addition, the switching mechanism of the magnetic vectors within the rounded edge region may activate the magnetic vectors arranged aligned with the substantially straight edges to change direction. In this manner, the starting point of the switching mechanism may be aligned with rounded edges of the MRAM cell junction. Consequently, lower current may be applied to switch a magnetic direction of an MRAM cell junction with rounded edges than an MRAM cell junction having substantially straight edges along all sides of the cell junction. However, as the need for lower power consumption within MRAM devices increases, further applications for reducing current requirements to switch the magnetic directions of MRAM cell junctions are needed.

Accordingly, it may be advantageous to develop an MRAM device configuration that further reduces the current needed to switch magnetic directions of MRAM cell junctions. In addition, it may be advantageous to develop an MRAM device configuration that offers more accurate and uniform write selectivity within an MRAM array.

SUMMARY OF THE INVENTION

The problems outlined above may be in large part addressed by a magnetic random access memory (MRAM) device that includes a conductive line configured to induce a magnetic field with a higher magnitude along at least a portion of a magnetic cell junction than along a spacing arranged adjacent to the magnetic cell junction. In some cases, the conductive line may be configured to induce the higher magnetic field magnitude along an entirety of the magnetic cell junction. In either embodiment, the conductive line may be arranged in contact with the magnetic cell junction and therefore, may serve as a bit line. In other cases, the conductive line may be spaced adjacent to the magnetic cell junction and therefore, may serve as a digit line. In either case, the MRAM device may further include a different conductive line configured to concurrently induce the magnetic field. For example, the different conductive line may be a bit or digit line of the MRAM device. In some cases, the different conductive line may be adapted to conduct a higher density of current along a first portion of the different conductive line than along a second portion of the different conductive line. In such an embodiment, the first portion of the different conductive line may be aligned with the portion of the magnetic cell junction receiving the higher magnetic field magnitude while the second portion of the conductive line may be aligned with the spacing arranged adjacent to the magnetic cell junction.

In some cases, the MRAM device described herein may be arranged within a semiconductor topography including a plurality of magnetic cell junctions spaced across the topography and a field-inducing line arranged adjacent to the plurality of the magnetic cell junctions. Such a field-inducing line may include first portions aligned with the plurality of magnetic cell junctions and second portions aligned with spacings between the plurality of magnetic cell junctions. In some cases, the first portions may be adapted to conduct a higher density of current than the second portions. In a preferred embodiment, the first portions of the field-inducing line may include different peripheral profiles than the second portions of the field-inducing line. More specifically, the first portions may include different pattern profiles than the second portions. For example, the first portions of the field-inducing line may have opposing edges, which are aligned at an angle greater than approximately 0° and less than approximately 90° relative to opposing edges of the second portions of the field-inducing line. In addition or alternatively, the first portions may include narrower pattern profiles than pattern profiles of the second portions. In yet another embodiment, the first portions of the field-inducing line may further or alternatively include different cross-sectional profiles than the second portions of the field-inducing line. For instance, the first portions may include thinner cross-sectional profiles than cross-sectional profiles of the second portions.

A method for fabricating an MRAM circuit is further contemplated herein. In particular, the method may include aligning magnetic cell junctions and first portions of a field-inducing line with each other such that at least a part of the first portions of the field-inducing line are configured to conduct a higher density of current than second portions of the field-inducing line. In some cases, the step of aligning the magnetic cell junctions and the first portions of the field-inducing line may include forming the field-inducing line above the magnetic cell junctions. In yet other embodiments, the step of aligning the magnetic cell junctions and the first portions of the field-inducing line may include patterning the magnetic cell junctions above the first portions of the field-inducing line. In either embodiment, the method may include forming the field-inducing line with first portions having different peripheral profiles than the second portions of the field-inducing line. For example, the step of forming the field-inducing line may include patterning the field-inducing line such that the first portions have a different pattern profile than the second portions. In addition or alternatively, the step of forming the field-inducing line may include forming the field-inducing line such that the first portions have a different cross-sectional profile than the second portions.

There may be several advantages to forming an MRAM device as described herein. In particular, the MRAM device described herein may provide more accurate and uniform write selectivity within an array of magnetic cell junctions arranged within the device. In this manner, the reliability of the device may be increased. In addition, the MRAM device described herein may allow lower currents to be used to switch the magnetic directions of the MRAM cell junctions within the array. Consequently, the MRAM device described herein may function with lower power requirements than conventional MRAM devices.

BRIEF DESCRIPTION OF THE DRAWINGS

Other objects and advantages of the invention will become apparent upon reading the following detailed description and upon reference to the accompanying drawings in which:

FIG. 9 depicts a partial cross-sectional view of a semiconductor topography in which portions of a field-inducing line aligned with magnetic cell junctions are thinner than portions of the field inducing line aligned with spacings arranged adjacent to the magnetic cell junctions;

FIG. 10 depicts a partial cross-sectional view of a semiconductor topography, in alternative embodiment, in which portions of a field-inducing line aligned with magnetic cell junctions are thinner than portions of the field inducing line aligned with spacings arranged adjacent to the magnetic cell junctions;

FIG. 11 depicts a method for fabricating an MRAM device; and

FIG. 12 depicts an alternative method for fabricating an MRAM device.

Figure 1:
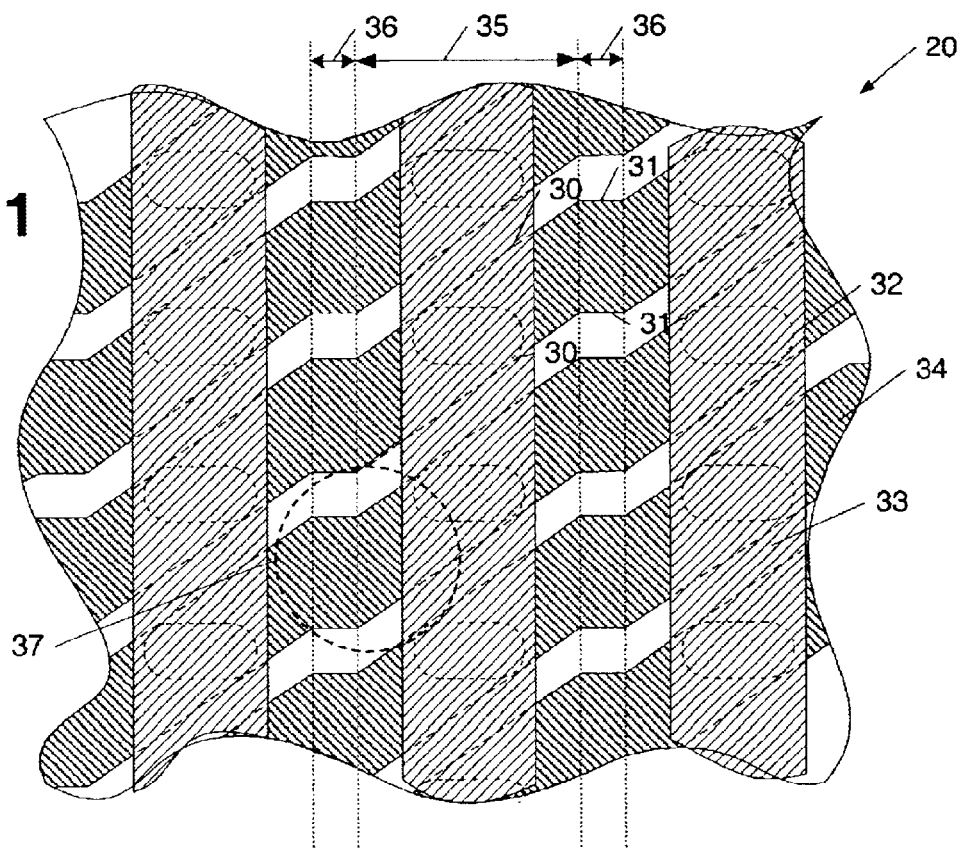
FIG. 1 depicts a partial top view of a semiconductor topography in which portions of a field-inducing line aligned with magnetic cell junctions are angled relative to portions of the field inducing line aligned with spacings arranged adjacent to the magnetic cell junctions.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of semiconductor topographies including a conductive line configured to induce a higher magnetic field along at least a portion of a magnetic cell junction included in the semiconductor topography than along a spacing arranged adjacent to the magnetic cell junction are shown in FIGS. 1–10. In particular, FIGS. 1–10 illustrate semiconductor topographies including a plurality of magnetic cell junctions spaced across the topographies and interposed between two sets of field-inducing lines. Each of the field-inducing lines includes first portions aligned with the plurality of the magnetic cell junctions and second portions aligned with spacings arranged between the plurality of magnetic cell junctions. In each embodiment, the first portions of at least one set of the field-inducing lines include a different peripheral profile than second portions of the same field-inducing lines. As explained in more detail below, a field-inducing line having portions of different peripheral profiles may advantageously allow a higher density of current to be conducted in regions of the field-inducing line, such as those arranged adjacent to the magnetic cell junctions.

FIGS. 1–10 depict either partial top or partial cross-sectional views of semiconductor topographies 20–27 in which magnetic cell junctions 32 have been arranged between a plurality of digit lines and a plurality of bit lines. Such bit and digit lines may serve as field-inducing lines of a magnetic random access memory (MRAM) device and therefore, semiconductor topographies 20–27 may include partial top or partial cross-sectional views of MRAM devices. As will be described in more detail below, each of semiconductor topographies 20–27 includes a different layout, pattern, and/or structure configuration of bit lines and digit lines and therefore, includes different reference numbers representing the respective lines. It is noted, however, that the layout, pattern, and/or structure configurations described herein are not restricted to the embodiments shown in FIGS. 1–10. In particular, the layout, pattern, and/or structure configurations described herein may be applied to any magnetic field-inducing line arranged within a topography including a magnetic cell junction. As such, the layout, pattern, and/or structure configurations described herein may be applied to either or both of the bit and digit lines of an MRAM device. In particular, one or all of the configurations described for bit lines and digit lines of semiconductor topographies 20–27 may be used and/or combined for the configurations of any bit lines and/or digit lines of an MRAM device.

In general, the plurality of bit lines within semiconductor topographies 20–27 may overly magnetic cell junctions 32 and respective underlying portions of the plurality of digit lines. As such, magnetic cell junctions 32 and respective underlying portions of the digit lines are represented by dashed lines in FIGS. 1–8, indicating that they are arranged below the bit lines. In other embodiments, however, the plurality of bit lines may be arranged below the magnetic cell junctions and the plurality of digit lines may be arranged above the bit lines. In either case, the bit and digit lines of the topographies described herein are preferably arranged such that the overall direction of the lines are at an angle greater than approximately 0° and less than or equal to approximately 90° with respect to each other. Consequently, portions of the digit lines not covered by the bit lines are not outlined by dashed lines in FIGS. 1–8. The overall direction of a line, as used herein, may refer to the general direction extending between the two ends of a line relative to other structures within a device.

Semiconductor topographies 20–27 may also include other structures and layers arranged above, below and in-between the structures and layers shown in FIGS. 1–10. For example, semiconductor topographies 20–27 may include gate structures, interlevel dielectrics, contacts, vias, and interconnect lines. Cross-sectional views of exemplary topographies including some of such layers and structures are shown in FIGS. 9 and 10, but are not shown in FIGS. 1–8 to simplify the illustration of FIGS. 1–8. Moreover, semiconductor topographies 20–27 may continue beyond the peripheries of the topography shown in FIGS. 1–10. In this manner, semiconductor topographies 20–27 may include additional structures and layers arranged adjacent to the layers and structures shown in FIGS. 1–10. In some embodiments, such additional structures and layers may be substantially similar to the respective layers and structures illustrated in FIGS. 1–10. Furthermore, FIGS. 1–8 show magnetic cell junctions 32 in an elliptical shape. However, the layout, pattern, and/or structure configuration of bit lines and digit lines as described herein may be included with magnetic cell junctions of any shape. It is noted that the shape of magnetic cell junctions 32 shown in FIGS. 1–8 are merely shown as an exemplary embodiment and the configuration of bit lines and digit lines as described herein is not limited to devices including magnetic cell junctions with such a shape.

As noted above, magnetic cell junctions 32 may be interposed between a plurality of bit lines and digit lines in each of the embodiments illustrated in FIGS. 1–10. In general, the bit lines and digit lines of semiconductor topographies 20–27 may be adapted to conduct current and therefore may be made of any conductive material, such as aluminum, copper, titanium, tungsten, or any alloy of such metals. In some embodiments, the bit lines and/or digit lines may include a plurality of these metals and/or alloys such that a stack of conductive materials may be included within the lines. In either case, semiconductor topographies 20–27 may be adapted to pass current from bit lines through magnetic cell junctions such that information may be retrieved or "read" from magnetic cell junctions 32. In addition, semiconductor topographies 20–27 may be adapted to conduct current through bit lines and digit lines such that information may be programmed or "written" to magnetic cell junctions 32. In particular, such an adaptation to write to magnetic cell junctions 32 may be controlled by magnetic fields generated from current conducted through bit lines and digit lines. Since bit lines are generally used to pass current through magnetic cell junctions, "bit lines," as used herein, may refer to field-inducing lines arranged in contact with one or more magnetic cell junctions of an MRAM device. Digit lines, however, are generally only used to concurrently induce a magnetic field with a bit line during write operations of a device and therefore, are not typically formed in contact with magnetic cell junctions. Consequently, "digit lines," as used herein, may refer to field-inducing lines spaced vertically adjacent to one or more magnetic cell junctions of an MRAM device.

Turning to FIG. 1, semiconductor topography 20 is shown including magnetic cell junctions 32 vertically interposed between bit lines 33 and digit lines 34. In some cases, bit lines 33 may be conductive lines having substantially straight patterns of uniform widths as shown in FIG. 1. Such a configuration may allow current to flow in a substantially straight and fixed direction. In particular, bit lines 33 may be conductive lines substantially absent of differentiating portions. More specifically, each of bit lines 33 may be substantially absent of portions having different peripheral profiles than other portions of the same line. "Peripheral profiles," as used herein, may refer to the upper or cross-sectional peripheral outline of a structure or a region of a structure. Digit lines 34, on the other hand, may each include portions having different peripheral profiles than other portions within the same digit line. More specifically, digit lines 34 may include portions 35 and portions 36 having different pattern profiles. "Pattern profiles," as used herein, may refer to the upper peripheral outline of a structure or a region of a structure. In general, pattern profiles of structures may be formed during the fabrication of the device, such as during a patterning process. However, in other embodiments, a structure's pattern profile may be the result of several processing steps.

As shown in FIG. 1, portions 35 may be arranged at an angle greater than approximately 0° and less than approximately 90° with respect to portions 36. More specifically, opposing edges 30 of portions 35 may be aligned at an angle greater than approximately 0° and less than approximately 90° relative to opposing edges 31 of portions 36. Consequently, in such an embodiment, portions 36 may have a rectangular shape, while portions 35 may have a parallelogram shape having two angles greater than approximately 90' and two angles less than approximately 90°. Other shapes of portions 35 and 36, however, may be fabricated depending of the design specifications and the layout configuration of the device. In either case, portions 35 may include a different pattern profile than portions 36. In addition or alternatively, digit lines 34 may include portions with narrower pattern profiles than other portions of the same digit lines 34. Embodiments with such a configuration are described in more detail below in reference to FIGS. 4, 6, and 8. In yet other embodiments, portions 35 may alternatively or additionally have different cross-sectional profiles than portions 36. "Cross-sectional profiles" as used herein may refer to the cross-sectional peripheral outline of a structure or a region of a structure. An embodiment with such a configuration is described in more detail below in reference to FIG. 9.

Although FIG. 1 illustrates digit lines 34 arranged in a upward slope configuration, the devices and topographies described herein are not limited to field-inducing lines arranged in the opposite, downward direction. Consequently, semiconductor topography 20 may alternatively include digit lines 34 arranged in a downward slope direction, in some embodiments. Such an alternative configuration may be applied in any embodiment in which the overall direction of a field-inducing line is arranged at an angle between approximately 0° and approximately 90° relative to another field-inducing line of the device. Consequently, such an alternative configuration may be applicable for the embodiments described in more detail below in reference to FIGS. 3, 7, and 8. In either embodiment, a field-inducing line having an overall direction between approximately 0° and approximately 90° relative to another field-inducing line of the device may be referred to herein as being "angled."

Figure 2:
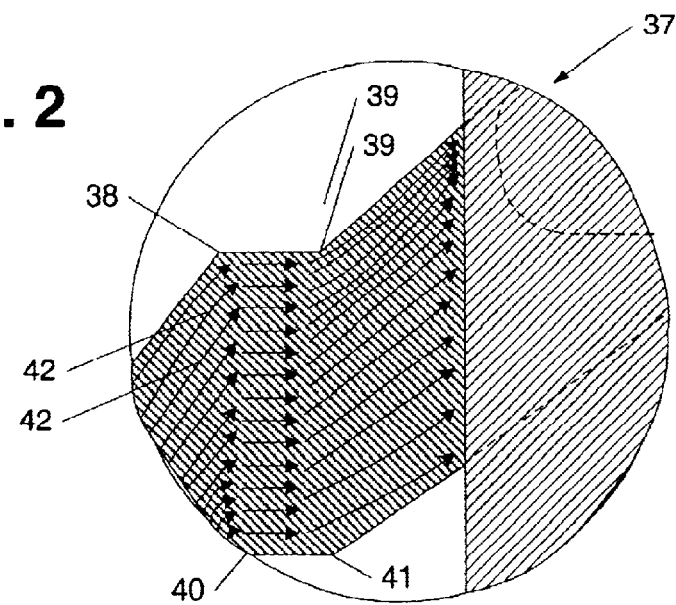
FIG. 2 depicts a magnified view of an exemplary flow of current through a portion of the semiconductor topography of FIG. 1.

Due to the different pattern profiles included in digit lines 34, digit lines 34 may include junction interfaces between portions 35 and 36. A magnified view of portion 37 of semiconductor topography 20 is depicted in FIG. 2 illustrating the distribution of current within one of digit lines 34, specifically showing the junction interfaces between portions 35 and 36. As shown in FIG. 2, the junction interfaces between portions 35 and 36 may include corners 39 and 40, which are adapted to generate a higher density of current relative to other regions of digit lines 34. In general, current follows the shortest and easiest path (i.e., the path of least resistance). As such, current applied to digit lines 34 may flow at a higher density at corners 39 and 40 since the respective regions of digit lines 34 provides a shorter path than those regions corresponding to opposing corners of digit lines 34. In particular, FIG. 2 illustrates a higher density of current 42 in the region corresponding to corners 39 and 40 than respective opposing corners 41 and 38.

In this manner, digit lines 34 may be configured to induce a magnetic field of higher magnitude about regions of semiconductor topography 20 closer to corners 39 and 40 than in regions of semiconductor topography 20 farther away from corners 39 and 40. Consequently, digit lines 34 may be configured to induce relatively high magnetic fields at the ends of magnetic cell junctions 32 since corners 39 and 40 are relatively close to magnetic cell junctions 32. In particular, digit lines 34 may be configured to induce a relatively high magnetic field at the leftmost ends of magnetic cell junctions 32 in FIG. 1 when current is applied in the direction shown in FIG. 2. In yet other embodiments, digit lines 34 may be configured to induce a relatively high magnetic field at the rightmost ends of magnetic cell junctions 32 in FIG. 1 when current is applied in the opposite direction than shown in FIG. 2.

As discussed previously, the magnetic vectors within rounded edge regions of magnetic cell junctions may be apt to switch their magnetic direction before the magnetic vectors aligned with the substantially straight edges of the magnetic cell junctions. In this manner, the switching mechanism starting point for magnetic cell junctions 32 may be at the rounded edges of the magnetic cell junctions. "Switching mechanism" as described herein, may refer to the process of changing the magnetic direction of a magnetic cell junction 180° relative to its previous direction. Consequently, "switching mechanism starting point" as described herein, may refer to the place within the magnetic cell junction at which the direction change is initiated. Accordingly, in some cases, the switching mechanism of the magnetic vectors arranged within the rounded edge regions of the magnetic cell junction may activate the magnetic vectors arranged aligned with the substantially straight edges of the magnetic cell junction to change direction. As such, digit lines 34 having different pattern profiles, as described above, may be advantageous for inducing a higher magnetic field along the switching mechanism starting point of magnetic cell junctions than spacings arranged adjacent to the magnetic cell junctions. In particular, digit lines 34 having an angled pattern relative to bit lines 33 may be advantageous for inducing a higher magnetic field along portions of magnetic cell junctions 32 adjacent to corners 39 or 40 as compared to spacings of semiconductor topography 20 arranged adjacent to magnetic cell junctions 32.

Consequently, digit lines 34 may be configured to induce a magnetic field with a higher magnitude along at least a portion of magnetic cell junctions 32 than along spacings arranged adjacent to magnetic cell junctions 32. In some cases, digit lines 34 may be configured induce a higher magnetic field along an entirety of magnetic cell junctions 32. Embodiments including such a configuration are described in more detail below in reference to FIGS. 4 and 6. Furthermore and as stated above, such a configuration may be additionally or alternatively applied to bit lines 33. As such, in some cases, both bit lines 33 and digit lines 34 may be adapted to induce a magnetic field with a higher magnitude along at least a portion of magnetic cell junctions 32 than along spacings arranged adjacent to magnetic cell junctions 32. Alternatively, bit lines 33, alone, may be adapted to induce a magnetic field with a higher magnitude along at least a portion of magnetic cell junctions 32 than along spacings arranged adjacent to magnetic cell junctions 32.

In any embodiment, selected magnetic cell junctions of a device having an angled field-inducing line may be exposed to higher magnetic fields than selected magnetic cell junctions in conventional devices. Consequently, the current required to switch selected magnetic cell junctions in the device described above may be lower relative to current magnitudes used in conventional devices. As such, lower current magnitudes may be used for the device described above as compared to conventional devices. Consequently, the overall power requirements of a device including a field-inducing line with an angled configuration may be reduced as compared to a device having substantially straight and uniform-width bit and digit lines.

In addition or alternatively, the configuration of an angled field-inducing line as described above may increase the write selectivity of a device including such a field-inducing line, in some cases. In particular, a device having one set of field-inducing lines with such a configuration may increase the write selectivity of the device. Write selectivity, as used herein, may refer to the ratio of selected cells and disturbed cells switched during a write operation of a device. As stated above, selected magnetic cell junctions of the device described herein may be exposed to higher magnetic fields than in conventional devices. However, a device having just one set of angled field-inducing lines relative to another set of field-inducing lines of the device only induces a higher magnetic field along half of the disturbed cells of the device. More specifically, only the disturbed cells aligned with the angled field-inducing lines are exposed to an increased magnetic field magnitude as compared to the disturbed cells along the other field-inducing lines within the device. As such, a higher number of selected cells may be switched in a device with such a configuration than the number of disturbed cells within such a device. Consequently, the write selectivity of the device may be increased.

As shown in FIG. 1, portions 35 may be vertically aligned with magnetic cell junctions 32 and portions 36 may be vertically aligned with a portion of the spacings arranged adjacent to magnetic cell junctions 32. "Vertically aligned" as used herein, may refer to the arrangement of structural portions of a semiconductor topography directly above or below other structural portions of the semiconductor topography. Such a reference, however, does not necessarily dictate that the lateral boundaries of such structural portions be directly above or below one another. As such, although the lateral boundaries of portions 35 may extend beyond the lateral peripheries of magnetic cell junctions 32 (as shown in FIG. 1), portions 35 may still be considered to be vertically aligned with magnetic cell junctions 32 since at least another part of portions 35 extend below magnetic cell junctions 32. In some cases, however, it may be advantageous to limit the amount portions 35 extend beyond the lateral peripheries of magnetic cell junctions 32. In particular, it may be advantageous to configure the interface junctions of a field-inducing line having portions including different pattern profiles to be aligned as much as possible with the lateral peripheries of magnetic cell junctions. In this manner, a higher magnetic field may be generated closer to the end of the magnetic cell junctions and thus, closer to the switching mechanism starting point of the magnetic cell junctions. Consequently, such a device may benefit even more from reduced current requirements and increased write selectivity than the device depicted in FIG. 1.

Figure 3:
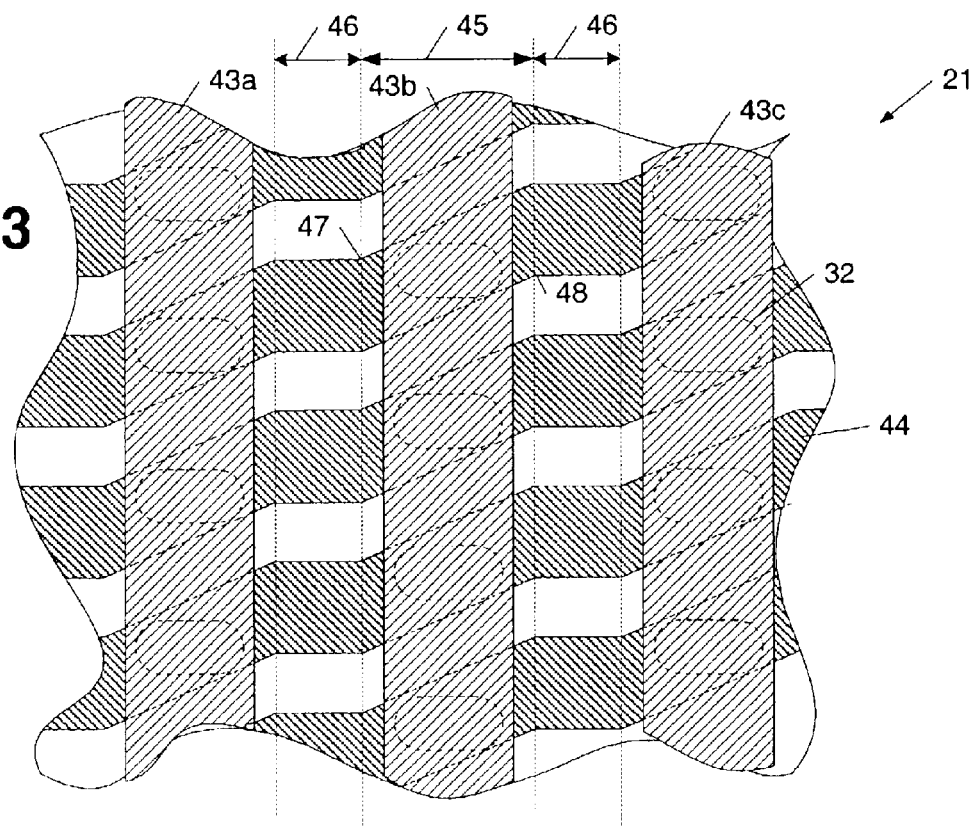
FIG. 3 depicts a partial top view of a semiconductor topography, in an alternative embodiment, in which a column of magnetic cell junctions is substantially unaligned with other columns of magnetic cell junctions.

One manner with which to fabricate portions of a field-inducing line to have relatively small regions extending from the lateral peripheries of magnetic cell junctions is to arrange the magnetic cell junctions in a staggered configuration across a semiconductor topography. An exemplary embodiment of such a configuration is illustrated in FIG. 3. In particular, FIG. 3 illustrates semiconductor topography 21 including magnetic cell junctions 32 interposed between bit lines 43a–43c and digit lines 44. As shown in FIG. 3, magnetic cell junctions 32 aligned with bit line 43b are not positioned in direct lateral alignment with magnetic cell junctions 32 aligned with bit lines 43a and 43b. Rather, magnetic cell junctions 32 aligned with bit line 43b are staggered or shifted relative to the positions of magnetic cell junctions 32 aligned with bit lines 43a and 43c. Such a configuration may allow portions 45 of digit lines 44 aligned with magnetic cell junctions 32 to include smaller regions extending from the lateral peripheries of magnetic cell junctions 32. In addition, such a configuration may allow portions 46 of digit lines 44 aligned with spacings arranged adjacent to the magnetic cell junctions 32 to be wider. In this manner, corners 47 and 48 may be closer to the ends of magnetic cell junctions 32 to thereby decrease current requirements and/or increase write selectivity. It is noted that the layout arrangement of magnetic cell junctions 32 across semiconductor topography 21, in such an embodiment, is not restricted to the arrangement shown in FIG. 3. In particular, magnetic cell junctions 32 may be arranged in any layout configuration.

Figure 4:
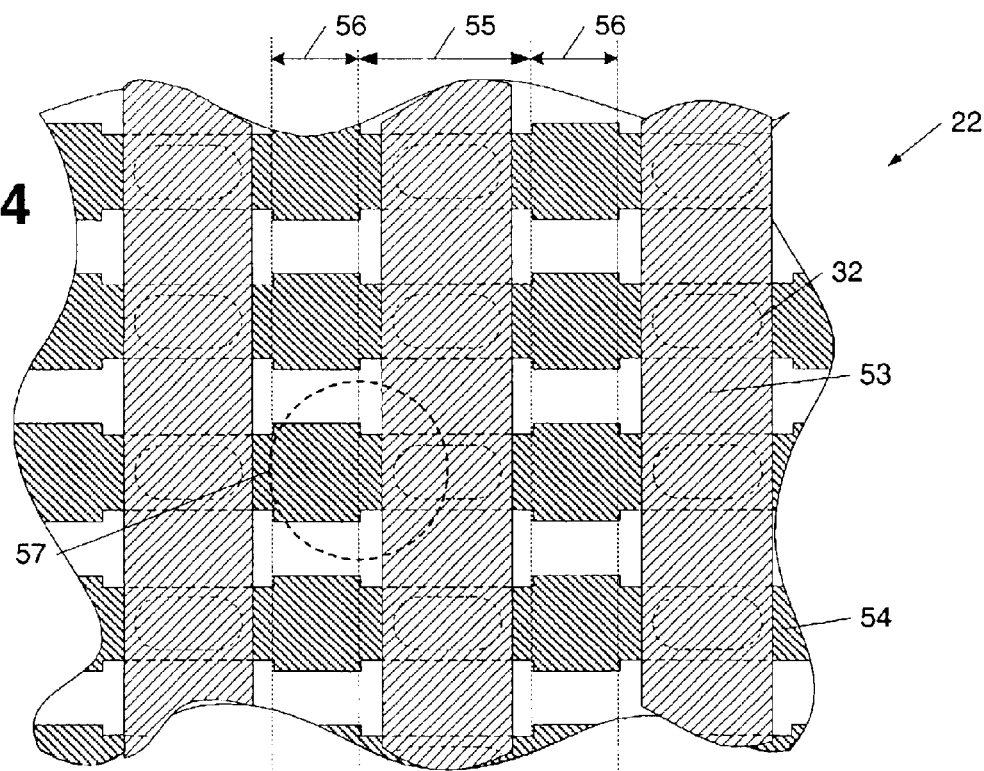
FIG. 4 depicts a partial top view of a semiconductor topography, in alternative embodiment, in which portions of a field-inducing line aligned with magnetic cell junctions are narrower than portions of the field inducing line aligned with spacings arranged adjacent to the magnetic cell junctions.

As stated above, in some embodiments, the topography described herein may include a field-inducing line having portions with a different cross-sectional profile than other portions of the field-inducing line. An exemplary topography including such a configuration is illustrated in FIG. 4. "Cross-sectional profile," as used herein, may refer to the cross-sectional peripheral outline of a structure or a portion of a structure. FIG. 4 illustrates semiconductor topography 22 including magnetic cell junctions 32 vertically interposed between bit lines 53 and digit lines 54. Bit lines 53 may be configured substantially similar to bit lines 33 and 43a–43c of FIGS. 1 and 3, respectively. Digit lines 54, however, may include portions 55 aligned with magnetic cell junctions 32 having a substantially narrower width than portions 56 aligned with spacings arranged adjacent to magnetic cell junctions 32. Such a configuration of digit lines 54 may allow a higher density of current to be conducted in portions 55 as compared to portions 56.

Figure 5:
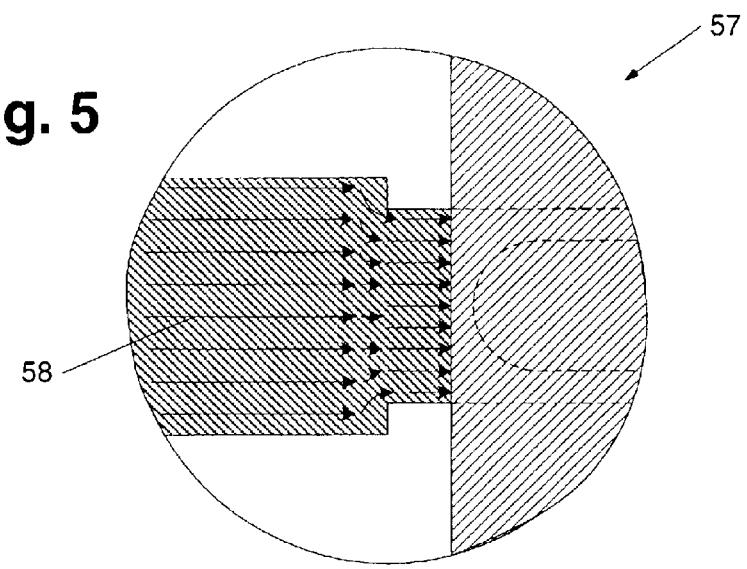
FIG. 5 depicts a magnified view of an exemplary flow of current through a portion of the semiconductor topography of FIG. 4.

An illustration of the distribution of current through a portion of digit lines 54 is shown in FIG. 5. In particular, FIG. 5 illustrates a magnified view of portion 57 of semiconductor topography 22. As shown in FIG. 5, there is a higher density of current 58 within portions 55 than in portions 56 due to the reduction in the width of the line. Since such a reduction of width is in alignment with the entirety of magnetic cell junctions 32, digit lines 54 may be configured to induce a higher magnetic field along an entirety of magnetic cell junction 32. Alternatively, digit lines 54 may be configured to induce a higher magnetic field along a portion of magnetic cell junctions 32. In such an embodiment (not shown), portions of digit lines 54 of relatively narrower width as compared to other portions of digit line 54 may only extend in alignment with a portion of magnetic cell junctions 32. For example, digit line 54, in such an embodiment, may include an interfaced junction interposed between portions of differing widths directly below magnetic cell junctions 32.

In either case, the higher density of current conducted through the narrower portions of the field-inducing line will produce a relatively higher magnetic field about such a portion of the field-inducing line. Such a magnitude may be higher than is needed to switch a selected cell. Consequently, the inclusion of a field-inducing line having portions with relatively narrower widths vertically aligned with magnetic cell junctions of a device may advantageously allow lower current magnitudes to be used for switching selected cells as compared to current magnitudes conducted in field-inducing lines of substantially uniform width. In this manner, the overall power requirements of the device described herein may be lower than conventional devices. In addition, the write selectivity of the device described herein may be increased relative to conventional devices. In particular, a higher ratio of selected cells to disturbed cells may be switched in the device described herein than in conventional devices. Such an increased ratio may be due to the higher magnetic field induced along selected magnetic cell junctions as compared to disturbed magnetic cell junctions.

Figure 6:
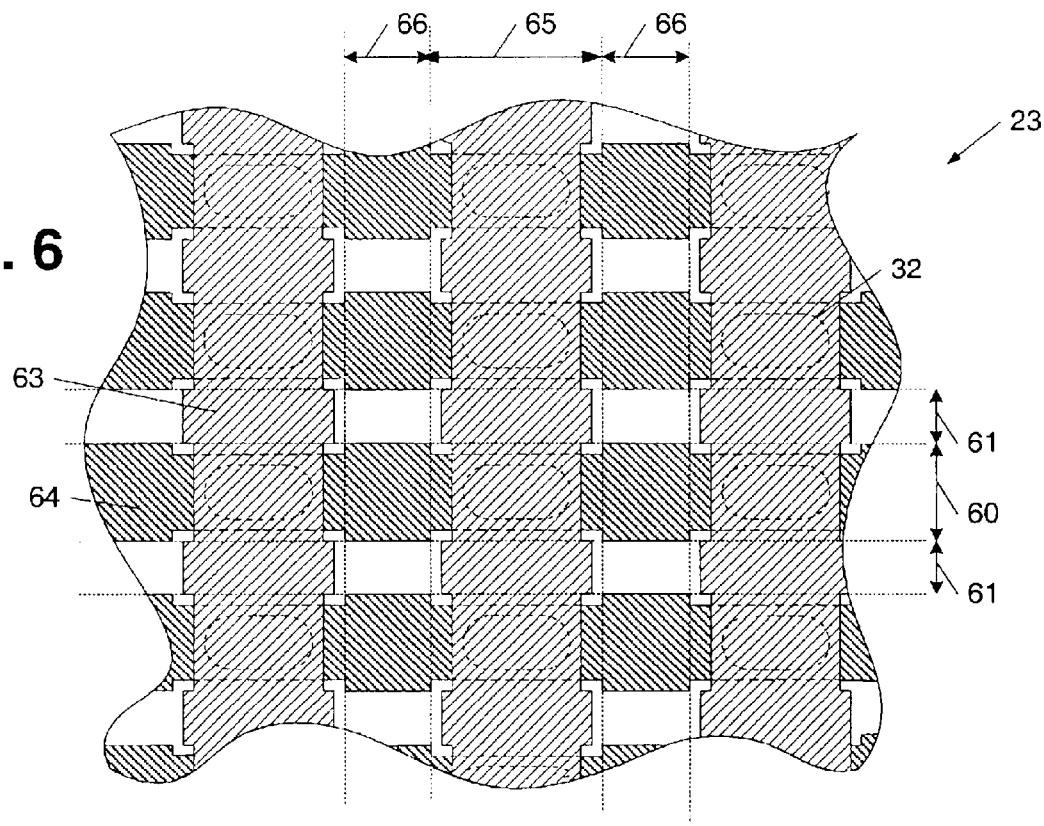
FIG. 6 depicts a partial top view of a semiconductor topography, in alternative embodiment, in which portions of two field-inducing lines aligned with magnetic cell junctions are narrower than portions of the field inducing lines aligned with spacings arranged adjacent to the magnetic cell junctions.
Figure 7:
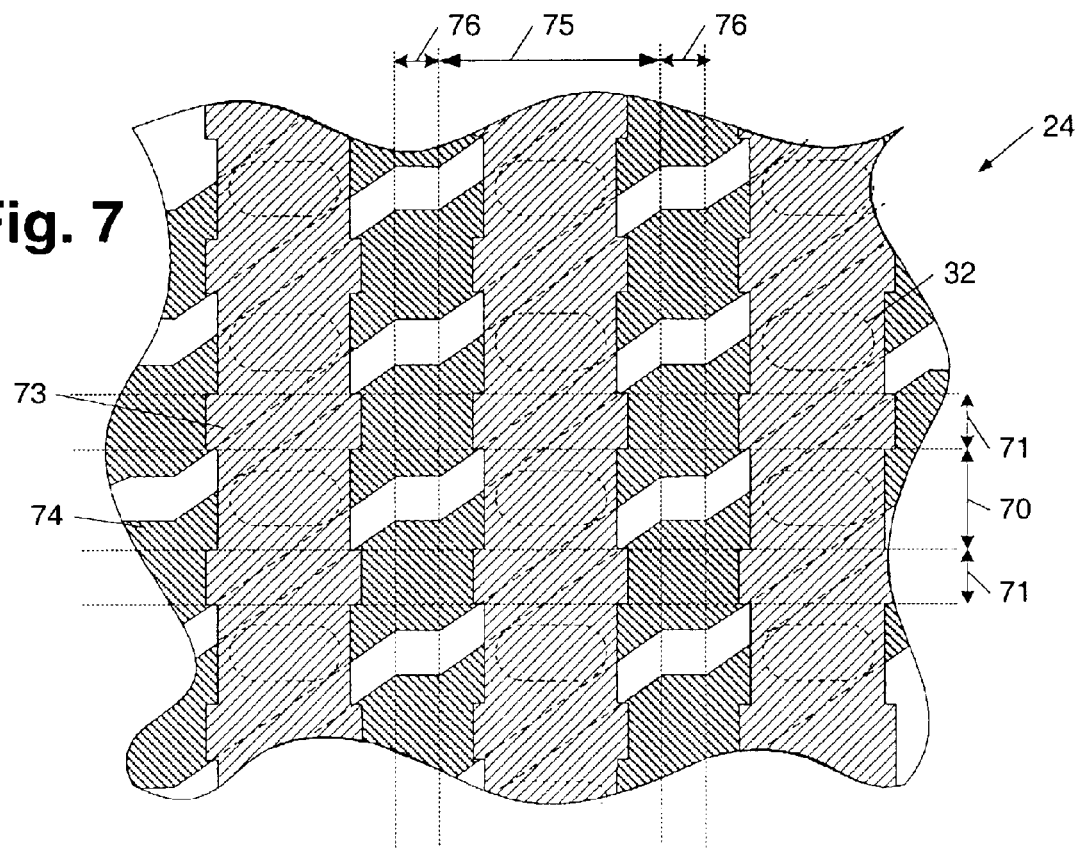
FIG. 7 depicts a partial top view of a semiconductor topography, in alternative embodiment, in which portions of a first field-inducing line aligned with magnetic cell junctions are angled relative to portions of the first field inducing line aligned with spacings arranged adjacent to the magnetic cell junctions and in which portions of a second field-inducing line aligned with magnetic cell junctions are narrower than portions of the second field inducing line aligned with spacings arranged adjacent to the magnetic cell junctions.

FIGS. 6 and 7 depict yet other embodiments in which both bit lines and digit lines are configured to induce a magnetic field with a higher magnitude along at least portions of magnetic cell junctions than along spacings arranged adjacent to the magnetic cell junctions. In particular, FIG. 6 depicts semiconductor topography 23 including magnetic cell junctions 32 vertically interposed between bit lines 63 and digit lines 64. As shown in FIG. 6, digit lines 64 may be configured in a similar manner to digit lines 54 of FIG. 4. As such, digit lines 64 may include portions 65 aligned with magnetic cell junctions 32 having a narrower width than portions 66 aligned with spacings arranged adjacent to magnetic cell junctions 32. Bit lines 63 may be configured similarly. In particular, bit lines 63 may include portions 60 aligned with magnetic cell junctions 32 having a narrower width than portions 61 aligned with spacings arranged adjacent to magnetic cell junctions 32. In an alternative embodiment (not shown), bit lines 63 and digit line 64 may each include angled portions aligned with magnetic cell junctions 32. In such an embodiment, bit lines 63 and digit lines 64 may include portions aligned with magnetic cell junctions 32 having opposing edges arranged at an angle greater than approximately 0° and less than approximately 90° relative to the opposing edges of portions aligned with spacings arranged adjacent to magnetic cell junctions 32. Such a configuration may preferably include orienting bit lines and digit lines in opposite directions (i.e., downward and upward slopes, respectively or vice versa).

In yet another embodiment, the topography described herein may include some field-inducing lines with angled portions and other field-inducing lines with varying widths. FIG. 7 depicts semiconductor topography 24 including magnetic cell junctions 32 vertically interposed between bit lines 73 and digit lines 74. As shown in FIG. 7, bit lines 73 may include a configuration similar to that of bit lines 63 of FIG. 6. In particular, bit lines 73 may include may include portions 70 aligned with magnetic cell junctions 32 having a narrower width than portions 71 aligned with spacings arranged adjacent to magnetic cell junctions 32. Digit lines 74, however, may be configured similar to bit lines 34 of FIG. 1. In particular, digit lines 74 may include portions 75 aligned with magnetic cell junctions 32 having opposing edges arranged at an angle greater than approximately 0° and less than approximately 90° relative to the opposing edges of portions 76 aligned with spacings arranged adjacent to magnetic cell junctions 32.

In an alternative embodiment (not shown), the configurations of bit lines 73 and digit lines 74 may be reversed. In such a case, bit lines 73 may include portions aligned with magnetic cell junctions 32 having opposing edges arranged at an angle greater than approximately 0° and less than approximately 90° relative to the opposing edges of portions aligned with spacings arranged adjacent to magnetic cell junctions 32. In addition, digit lines 74 may include portions aligned with magnetic cell junctions 32 having a narrower width than portions aligned with spacings arranged adjacent to magnetic cell junctions 32. In either case, magnetic cell junctions 32 may be configured in a staggered arrangement across semiconductor topography 24 similar to the manner described for semiconductor topography 21 of FIG. 3.

In any case, the configurations described in reference to FIGS. 6 and 7 may advantageously reduce the current requirements of the MRAM device, thereby reducing the overall power requirements of the device. In particular, the configurations described in reference to FIGS. 6 and 7 may reduce current requirements of a device as compared to the configurations described in reference to FIGS. 1, 3, and 4. Since both the bit lines and digits lines of the devices described in reference to FIGS. 6 and 7 are configured to induce a magnetic field with a higher magnitude along at least a portion of a magnetic cell junction than along a spacing arranged adjacent to the magnetic cell junction, a significantly lower amount of current may be needed to switch selected cells. On the other hand, the configurations described in reference to FIGS. 6 and 7 may not necessarily increase write selectivity of a device relative to write selectivity of conventional devices. Since all disturbed cells are exposed to substantially the same magnetic field magnitude, in such an embodiment, the ratio of switching selected cells versus disturbed cells is not necessarily increased relative to conventional devices.

Figure 8:
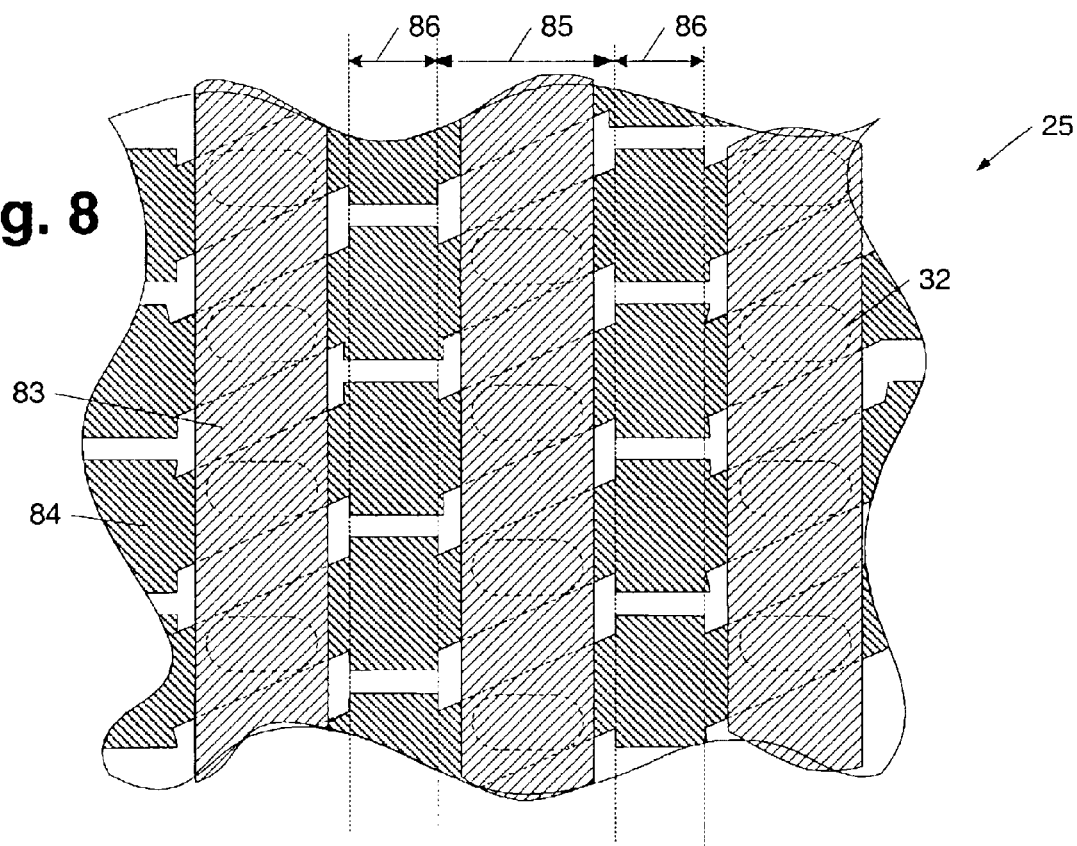
FIG. 8 depicts a partial top view of a semiconductor topography, in alternative embodiment, in which portions of a field-inducing line aligned with magnetic cell junctions are narrower and angled relative to portions of the field inducing line aligned with spacings arranged adjacent to the magnetic cell junctions.

An exemplary embodiment of a semiconductor topography with yet another field-inducing line configuration is illustrated in FIG. 8. In particular, FIG. 8 illustrates semiconductor topography 25 with field-inducing lines having portions including both different pattern profiles and different cross-sectional profiles. As shown in FIG. 8, semiconductor topography 25 includes magnetic cell junctions 32 vertically interposed between bit lines 83 and digit lines 84. Bit lines 83 may be configured substantially similar to bit lines 33 and 43a–43c of FIGS. 1 and 3, respectively. Digit lines 84, on the other hand, may be configured to include portions 85 aligned with magnetic cell junctions 32 having opposing edges arranged at an angle greater than approximately 0° and less than approximately 90° relative to the opposing edges of portions 86 aligned with spacings arranged adjacent to magnetic cell junctions 32. In addition, portions 85 may have a smaller width than portions 86. In this manner, digit lines 84 may include portions having different pattern profiles and different cross-sectional profiles. In an alternative embodiment, bit lines 83 may also be configured to have portions with different pattern profiles and different cross-sectional profiles in a similar manner to digit lines 84. In yet other embodiments, bit lines 83, alone, may be configured with such a dual pattern differentiation between portions of the field-inducing lines. In such a case, digit line 84 may include field-inducing lines having a substantially straight and uniform width outline.

Further embodiments of topographies including a field-inducing line configured to induce a magnetic field with a higher magnitude along at least a portion of magnetic cell junctions 32 than along spacings arranged adjacent to magnetic cell junctions 32 are depicted in FIGS. 9 and 10. In some embodiments, the configurations of FIGS. 9 and 10 may be included in semiconductor topographies 20–25 to further enhance the benefits of inducing a higher magnetic field. In other embodiments, the configuration of FIGS. 9 and 10 may not be included in semiconductor topographies 20–25, but rather serve as an alternative embodiment in which to induce a higher magnetic field. Both of the configurations of FIGS. 9 and 10 include a field-inducing line having portions with different cross-sectional profiles than other portions of the field-inducing line. In particular, the embodiments of FIGS. 9 and 10 include field-inducing lines with portions having different thicknesses than other portions of the field-inducing lines.

FIG. 9 depicts a cross-sectional view of semiconductor topography 26 taken along the length of a bit line of an MRAM device. As such, semiconductor topography 26 includes magnetic cell junctions 32 vertically interposed between bit line 93 and digit lines 94. In addition, semiconductor topography 26 may also include other structures and layers, such as electrodes 92, conductors 96, and dielectrics 98 and 99. In particular, electrodes 92 may be spaced above digit lines 94 by dielectric 98 and conductors 96 may be laterally spaced apart from digit lines 94 by dielectric 99. In addition, semiconductor topography 26 may include other structures and layers not shown in FIG. 9. In particular, semiconductor topography 26 may include additional structures and/or layers arranged above, below and in-between the structures and layers shown in FIG. 9.

In general, bit line 93 and digit lines 94 may be configured in a manner similar to the configurations described in reference to FIGS. 1–8. For example, in some embodiments, bit line 93 and/or digit lines 94 may include portions with different peripheral profiles than other portions of bit lines 93 and digit lines 94, respectively. In particular, portions of bit line 93 and/or digit lines 94 may be narrower or be positioned at an angle relative other portions of bit line 93 and digit lines 94. Alternatively, bit line 93 and/or digit lines 94 may include structures that are substantially straight and of uniform width. In either embodiment, bit line 93 may include portions 100 aligned with magnetic cell junctions 32 and portions 102 aligned with spacings arranged laterally adjacent to magnetic cell junctions. As shown in FIG. 9, portions 100 may have different cross-sectional profiles than portions 102. In particular, portions 100 may have a smaller thickness than portions 102. Such a reduction in thickness may allow a greater density of current to be conducted in portions 100 as compared in portions 102. In particular, reducing the thickness of a field-inducing line may condense the current conducted through the line in a similar manner in which reducing the width of the line may be used as described above in reference to FIG. 5. Consequently, magnetic cell junctions 32 may be exposed to a higher magnetic field than spacings arranged laterally adjacent to magnetic cell junctions 32.

FIG. 10 depicts yet another embodiment in which a field-inducing line may be configured to induce a magnetic field of higher magnitude along at least portions of magnetic cell junctions than along spacings arranged adjacent to the magnetic cell junctions. In particular, FIG. 10 illustrates a partial cross-sectional view of semiconductor topography 27 taken along a digit line of an MRAM device. As shown in FIG. 10, semiconductor topography 27 may include magnetic cell junctions 32 vertically interposed between bit lines 113 and digit line 114. Semiconductor topography 27 may further include other structures and layers similar to the additional structures and layers described in reference to FIG. 9. For example, semiconductor topography 27 may include electrode 92 and dielectric 98 arranged above digit line 114 and dielectric 99 arranged below digit line 114. In addition, semiconductor topography 27 may include other structures and layers not shown in FIG. 10, such as gate structures, interlevel dielectrics, contacts, vias, and interconnect lines.

Bit lines 113 may be configured in a manner similar to the configurations described in reference to FIGS. 1–8. For example, in some embodiments, bit lines 113 may include structures that are substantially straight and have uniform width. In other embodiments, bit lines 113 may include portions with different peripheral profiles than other portions of bit lines 113. In particular, portions of bit lines 113 may be narrower or be positioned at an angle relative other portions of bit lines 113. Similarly, digit line 114 may include portions that are narrower or positioned at an angle relative other portions of digit line 114. Alternatively, digit line 114 may include a structure that is substantially straight and has uniform width. In either embodiment, digit line 114 may include a structure of varying thickness. In particular, portions 116 of digit line 114 aligned with magnetic cell junctions 32 may have a smaller thickness than portions 115 of digit lines 114 aligned with spacings adjacent to magnetic cell junctions 32. Such a configuration of a field-inducing line may advantageously increase the density of current in regions of digit line 114 aligned with magnetic cell junctions 32, thereby inducing a higher magnetic field along magnetic cell junctions 32 than along spacings arranged adjacent to magnetic cell junctions 32.

Exemplary methods for fabricating an MRAM circuit including a field-inducing line adapted to induce a magnetic field with a higher magnitude along at least a portion of a magnetic cell junction than along a spacing arranged adjacent to the magnetic cell junction are shown in FIGS. 11 and 12. Each method includes aligning magnetic cell junctions and first portions of a field-inducing line with each other. In a preferred embodiment, the method may be adapted such that at least part of the first portions of the field-inducing line is configured to conduct a higher density of current than other portions of the field-inducing line. Such a configuration of the field-inducing line may include any of the embodiments described in reference to FIGS. 1–10. In some cases, the method may include aligning magnetic cell junctions with two field-inducing lines with such configurations. An exemplary embodiment of a topography fabricated using such a method is shown in FIGS. 6 and 7. In addition, the field-inducing line fabricated using the method described herein may be a bit line or a digit line of the MRAM circuit. As such, the method described herein may include aligning magnetic cell junctions and a field-inducing line in contact with each other or spaced from each other.

As such, the method described herein may include forming a field-inducing line above and/or below magnetic cell junctions. For example, FIG. 11 depicts a method in which a field-inducing line with different peripheral profile portions is fabricated above the one or more magnetic cell junctions. In particular, the method depicted in FIG. 11 includes step 120, which includes forming one or more magnetic cell junctions spaced across a topography. The method further includes step 122 in which a field-inducing line is formed above the one or more magnetic cell junctions such that portions of the field-inducing line aligned with the magnetic cell junctions have a different peripheral profile than portions of the field-inducing line aligned with spacings arranged adjacent to the magnetic cell junctions. In yet another embodiment, the method of fabricating an MRAM device may follow the steps depicted in FIG. 12. In particular, the method of forming an MRAM device may include forming a field-inducing line upon a semiconductor topography with first portions having different peripheral profiles than second portions of the field-inducing line as indicated in step 124. In addition, the method may include forming magnetic cell junctions in alignment with the first portions of the field-inducing line as shown in step 126. In such an embodiment, the method may include forming the magnetic cell junctions either upon or spaced above the field-inducing line.

In some cases, the method of FIG. 11 may include a step (not shown) of forming an additional field-inducing line upon the semiconductor topography prior to forming the one or magnetic cell junctions. Likewise, the method of FIG. 12 may include a step (not shown) of forming an additional field-inducing line upon the magnetic cell junctions after step 126. Such an additional field-inducing lines may either include a structure that is substantially straight and has uniform width or a structure with portions having different peripheral profiles than other portions of the field-inducing line. In either embodiment, forming the field-inducing lines may include patterning at least one of the field-inducing lines such that first portions of the patterned field-inducing line have different pattern profiles than second portions of the patterned field-inducing line. In addition or alternatively, the step of forming the field-inducing lines may include forming at least one of the field-inducing lines such that first portions of the one field-inducing line has a different cross-sectional profile than second portions of the one field-inducing line.

It will be appreciated to those skilled in the art having the benefit of this disclosure that this invention is believed to provide a method and a system for processing a semiconductor topography. Further modifications and alternative embodiments of various aspects of the invention will be apparent to those skilled in the art in view of this description. For example, the topography, device, and method described herein may be applied to the fabrication of any field-inducing line within MRAM circuit. It is intended that the following claims be interpreted to embrace all such modifications and changes and, accordingly, the drawings and the specification are to be regarded in an illustrative rather than a restrictive sense.

What is claimed is:

1. A magnetic random access memory device, comprising:
   a magnetic cell junction; and
   a conductive line arranged adjacent to the magnetic cell junction and a region next to the magnetic cell junction, wherein the conductive line is configured to induce a magnetic field with a higher magnitude along substantially all of the magnetic cell junction than along the region next to the magnetic cell junction, and wherein the higher magnetic field is larger along an end of the magnetic cell junction than along a central portion of the magnetic cell junction.

2. The magnetic random access memory device of claim 1, wherein the conductive line is arranged in contact with the magnetic cell junction.

3. The magnetic random access memory device of claim 1, wherein the conductive line is spaced adjacent to the magnetic cell junction.

4. The magnetic random access memory device of claim 1, further comprising a different conductive line configured to concurrently induce the magnetic field.

5. The magnetic random access memory device of claim 4, wherein the different conductive line is adapted to conduct a higher density of current along a first portion of the different conductive line than along a second portion of the different conductive line, wherein the first portion of the different conductive line is aligned with the magnetic cell junction, and wherein the second portion of the different conductive line is aligned with the region next to the magnetic cell junction.

6. A semiconductor topography, comprising:
   a plurality of magnetic cell junctions spaced across the topography; and
   a field-inducing line arranged adjacent to the plurality of the magnetic cell junctions, wherein the field-inducing line comprises:
      first portions aligned with the plurality of magnetic cell junctions; and
      second portions aligned with spacings between the plurality of magnetic cell junctions, wherein opposing edges of the first portions are aligned at an angle greater than approximately 0° and less than approximately 90° relative to opposing edges of the second portions.

7. The semiconductor topography of claim 6, wherein the first portions are adapted to conduct a higher density of current than the second portions.

8. The semiconductor topography of claim 6, wherein the first portions comprise narrower pattern profiles than pattern profiles of the second portions.

9. The semiconductor topography of claim 6, wherein the first portions comprise different cross-sectional profiles than the second portions.

10. The semiconductor topography of claim 9, wherein the first portions comprise thinner cross-sectional profiles than cross-sectional profiles of the second portions.

11. A microelectronic topography, comprising:
    an array of magnetic cell junctions;
    a first conductive line configured to induce a magnetic field about a plurality of the magnetic cell junctions, wherein the magnetic field comprises a higher magnitude along plurality of the magnetic cell junctions than along spacings interposed between the plurality of magnetic cell junctions; and
    a second conductive line arranged adjacent to one of the plurality of magnetic cell junctions and has an overall direction not parallel to the first conductive line, wherein the second conductive line is configured to induce a second magnetic field with a higher magnetic along the magnetic cell junction than along a region neighboring the magnetic cell junction and adjacent to the second conductive line.

12. The microelectronic topography of claim 11, wherein the first conductive line is spaced adjacent to the plurality of magnetic cell junctions.

13. The microelectronic topography of claim 11, wherein the first conductive line is arranged in contact with the plurality of magnetic cell junctions.

14. The microelectronic topography of claim 11, wherein the first conductive line comprises:
   first portions aligned with the plurality of magnetic cell junctions: and
   second portions aligned with the spacings interposed between the plurality of magnetic cell junctions, wherein the first portions comprise different peripheral profiles than the second portions.

15. The microelectronic topography of claim 14, wherein opposing edges of the first portion are aligned at an angle greater than approximately 0° and less than approximately 90° relative to opposing edges of the second portions.

16. The microelectronic topography of claim 14, wherein the first portions comprise narrower pattern profiles of the second portions.

17. The microelectronic topography of claim 14, wherein the first portions comprise thinner cross-sectional profiles of the second portions.

18. The microelectronic topography of claim 11, further comprising a second conductive line configured to concurrently induce the magnetic field.

19. The microelectronic topography of claim 18, wherein the overall direction of the first conductive line is angled with respect to the second conductive line.

20. The microelectronic topography of claim 18, wherein the overall direction of the first conductive line is orthogonal with respect to the second conductive line.

* * * * *

UNITED STATES PATENT AND TRADEMARK OFFICE
CERTIFICATE OF CORRECTION

PATENT NO. : 6,891,193 B1
DATED : May 10, 2005
INVENTOR(S) : Schwarz

It is certified that error appears in the above-identified patent and that said Letters Patent is hereby corrected as shown below:

Title page,
Item [74], *Attorney, Agent, or Firm*, delete "Mollie E. Leiland" and substitute
-- Mollie E. Lettang --.

Column 16,
Line 58, after "with a higher," delete "magnetic" and substitute -- magnitude --.

Column 17,
Line 10, delete "portion" and substitute -- portions --.
Line 14, after "pattern profiles," insert -- than pattern profiles --.

Column 18,
Line 2, after "cross-sectional profiles," insert -- than cross-sectional profiles --.

Signed and Sealed this

Third Day of January, 2006

JON W. DUDAS
*Director of the United States Patent and Trademark Office*